United States Patent [19]

Hsieh

[11] 4,189,320

[45] Feb. 19, 1980

[54] LIGHT-SENSITIVE O-QUINONE DIAZIDE COMPOSITIONS AND PHOTOGRAPHIC REPRODUCTION PROCESSES AND STRUCTURES

[75] Inventor: Shane H. Hsieh, Somerville, N.J.

[73] Assignee: American Hoechst Corporation, Bridgewater, N.J.

[21] Appl. No.: 850,761

[22] Filed: Nov. 1, 1977

Related U.S. Application Data

[63] Continuation of Ser. No. 572,662, Apr. 29, 1975, abandoned.

[51] Int. Cl.$^2$ ............. G03C 1/54; G03C 1/70; G03F 7/00; G03F 7/08
[52] U.S. Cl. .................. 430/145; 430/192; 430/270; 430/277; 430/278; 430/302; 525/6; 525/504
[58] Field of Search ............ 96/75, 91 D, 115 R, 96/86 P, 33, 35.1, 36, 36.2, 36.3

[56] References Cited

U.S. PATENT DOCUMENTS

| | | | |
|---|---|---|---|
| 3,061,430 | 10/1962 | Uhlig et al. | 96/33 |
| 3,106,465 | 10/1963 | Neugebouer et al. | 96/33 |
| 3,201,239 | 8/1965 | Neugebouer et al. | 96/36.3 |
| 3,208,850 | 9/1965 | Daech | 96/49 |
| 3,396,019 | 8/1968 | Uhlig | 96/75 |
| 3,522,049 | 7/1970 | Poot et al. | 96/115 R |
| 3,533,796 | 10/1970 | Lassig et al. | 96/91 D |
| 3,551,154 | 12/1970 | DiBlas | 96/91 D |
| 3,652,272 | 3/1972 | Thomas | 96/75 |
| 3,655,625 | 4/1972 | Thomas | 96/75 |
| 3,660,097 | 5/1972 | Mainthia | 96/75 |
| 3,732,105 | 5/1972 | Klupfel et al. | 96/91 D |
| 3,793,033 | 2/1974 | Mukherjec | 96/75 |
| 3,890,152 | 6/1975 | Ruckert et al. | 96/91 D |

FOREIGN PATENT DOCUMENTS

| | | | |
|---|---|---|---|
| 2429251 | 1/1975 | Fed. Rep. of Germany | 96/75 |
| 975456 | 11/1964 | United Kingdom | 96/49 |
| 975457 | 11/1964 | United Kingdom | 96/49 |
| 1280885 | 7/1972 | United Kingdom | 96/75 |

*Primary Examiner*—Charles L. Bowers
*Attorney, Agent, or Firm*—James E. Bryan

[57] ABSTRACT

A light-sensitive coating composition and a light-sensitive photomechanical structure, such as a printing plate or a photoresist is produced by coating a suitable planar substrate with a condensation product of an organic isocyanate and a polymeric resin having functional groups reactive with the isocyanate, such as a phenol-formaldehyde resin, and a light-sensitive diazo compound, such as the esters and amides of quinone diazides, the coating being softenable by exposure to light and subsequent treatment with a conventional liquid printing plate developer, such as an aqueous alkaline solution and/or an organic solvent.

19 Claims, No Drawings

LIGHT-SENSITIVE O-QUINONE DIAZIDE COMPOSITIONS AND PHOTOGRAPHIC REPRODUCTION PROCESSES AND STRUCTURES

This is a continuation, of application Ser. No. 572,662, filed Apr. 29, 1975, now abandoned

BACKGROUND OF THE INVENTION

The present invention relates to light-sensitive compounds and compositions suitable for use in the graphic arts. More particularly, the present invention relates to the use of the condensation products of organic isocyanates and polymeric materials, carrying functional groups which are capable of reacting with the organic isocyanates, in the manufacture of printing plates and photoresists.

In the manufacture of positive-working printing plates and photoresists, derivatives diazides, as disclosed in U.S. Pat. Nos. 3,046,110–3,046,119, 3,046,121–3,046,124, 3,106,465, 3,148,983, 3,180,733, and 3,188,210, are widely used as light-sensitive materials. These naphthoquinone diazides are generally soluble in certain organic solvents but are not soluble in water, weak acids and weak alkalies. Coating solutions can be prepared utilizing one or more of these naphthoquinone diazide light-sensitive compositions in organic solvents and the solution then coated on a suitable substrate such as aluminum, zinc, copper, plastics, paper, etc. The choice of the substrate depends on the intended use of the structure. When a substrate, coated with one of these light-sensitive compositions, is exposed to light through an imaged transparency, naphthoquinone diazides, in the exposed areas, are believed to be decomposed to the indene carboxylic acids, which are soluble in a weak alkaline solution. Therefore, through the action of the light, a solubility differential between the exposed and unexposed areas results. The image can then be developed out by treatment with a proper weak alkaline developer solution and removal of the solubilized non-image areas.

The compounds described in the above-mentioned U.S. patents, many of which have been reported elsewhere, are low molecular weight esters and acid amides of quinone of naphthoquinone diazide. If such a compound is used individually, for instance, in the manufacture of lithographic printing plates, it is deposited in crystalline form, which results in lowering the mechanical strength of the image obtained and making long press runs difficult to attain. Accordingly, a suitable polymeric resinous material is usually used as a carrier for the light-sensitive compound to prevent it from cyrstallizing and to compensate for any weakening of the mechanical strength. Suitable polymeric materials, which are employed for this purpose, are alkali-soluble resins such as shellac, styrene-maleic anhydride copolymers, hydrophobic thermoplastic polyurethanes (U.S. Pat. No. 3,660,097) and, especially, low molecular weight condensation products of phenol and formaldehyde, the so-called 'novolaks' (U.S. Pat. Nos. 3,148,983 and 3,188,210 and many others). However, when an alkali-soluble resin, such as the novolak available under the tradename of "Alnovol PN 430", manufactured by Chemische Werk Albert, Wiesbaden-Biebrich, Germany, is used as recommended in the prior art, the unexposed areas of the sensitized coating do not possess the requisite adhesion to the substrate and tend to separate therefrom. Such a tendency becomes particularly manifest during the development operation, i.e., those instances wherein the plate is subjected to continued and prolonged immersion in the developer solution. Therefore, the image contrast and edge sharpness as well as press performance deteriorate. In cases where good plate performance is required, it is necessary to heat-treat the developed plates at an elevated temperature so that a more durable printing surface can be obtained. However, such treatment usually yields a surface with many pinholes and spots. Therefore, the commercial value of such a system is greatly reduced. Conversely, when a hydrophobic polymeric material, such as the "Estane" thermoplastic polyurethanes sold by B. F. Goodrich Company, is used as a carrier (U.S. Pat. No. 3,660,097) for the light-sensitive compounds, considerable difficulty is encountered in removing the exposed area of the sensitized coating, since the aqueous developer solution is uniformly repelled from the surface. Therefore, a preponderance of light-sensitive compounds would have to be incorporated in the coating compositions so that the sensitized layer will be more permeable to the alkaline developer. Use of a high percentage of sensitizer, in this manner, yields coatings which require long exposure time and are slow to develop, besides being unduly costly. In many instances, it is necessary to add a small amount of organic solvents to the alkaline developer to speed up the removal of the hydrophobic polymeric layer. In such cases, the resistance of the image areas to the alkaline developer is greatly reduced.

In accordance with the present invention, these drawbacks of the prior art can be overcome, or at least considerably minimized, by using polymeric materials which have been especially chemically modified for photographic reproduction applications.

One object of this invention is to provide such novel chemically-modified polymeric materials.

An additional object is to provide light-sensitive compositions containing isocyanate-modified polymeric materials.

A further object is to provide light-sensitive compositions, based on isocyanate-modified polymeric materials, and systems using these compositions to prepare lithographic printing plates, photoresists, and similar photomechanical images.

A still further object is to provide light-sensitive elements with improved image adhesion and developer resistance.

Additional objects will be apparent to those skilled in the art from the following detailed description of the present invention.

DETAILED DESCRIPTION OF THE INVENTION

In accordance with the present invention, there is provided a novel class of isocyanate-modified polymeric materials. The polymeric materials of this invention can be obtained by conventional methods of reacting organic isocyanates with suitable organic solvent-soluble polymers, bearing functional groups which are reactive toward the organic isocyanates. The organic solvents chosen as the reaction medium are inert toward and non-reactive with isocyanates, yet will readily dissolve the polymers to be modified. The polymeric materials obtained after such isocyanate modification, can be used, alone or in conjunction with other suitable polymeric materials, as carriers for light-sensitive quinone diazide compounds in a light-sensitive composition.

A detailed listing of the different functional groups which are reactive with organic isocyanates can be found in *Chemical Reviews*, vol. 57, pp. 47-76, 1957. Among the reactive groups mentioned, hydroxy, amino and thio groups are especially valuable, although other groups are not to be excluded. These functional groups may be substituted directly on the main polymer chain as well as on side chains.

The organic solvent-soluble polymeric material, carrying reactive groups, may be a natural polymer, a chemically-modified natural polymer, a synthetic polycondensation polymer or a polyaddition polymer, etc., provided it is organic solvent-soluble. The following polymers are also found to be useful: hydroxy-containing acrylic resins, such as copolymers containing hydroxyethyl methacrylate; polyesters of polyhydroxy intermediates, such as trimethylol propane, glycerol and sorbitol, which have hydroxyl groups remaining after incorporation in the polymer chain; aminoaryl- and hydroxyarylaldehyde resins, such as aniline-formaldehyde resin and phenol-formaldehyde resin; and the like.

Any of a variety of organic isocyanates can be employed in preparing the present isocyanate-modified polymers, including aromatic, aliphatic and cycloaliphatic monoisocyanates, diisocyanates and polyisocyanates and combinations thereof. Representative specific compounds, include; ethyl isocyanate, 2-chloroethyl isocyanate, butyl isocyanate, t-butyl isocyanate, hexyl isocyanate, octyl isocyanate, dodecyl isocyanate, phenyl isocyanate, o-, m-, p-chlorophenylisocyanates, o-, m-, p-methoxyphenyl-isocyanates, o-, m-, p-nitrophenyl isocyanates, o-, m-, p-tolyl isocyanates, cyclohexyl isocyanate, 1-naphthyl isocyanate, 2,4-toluene diisocyanate, m-phenylene diisocyanate, 1,4-tetramethylene diisocyanate, 1,6-hexamethylene diisocyanate, 1,4-cyclohexylene diisocyanate, 1,5-tetrahydronaphthalene diisocyanate, trimethylhexamethylene diisocyanate, tris (4-isocyanatophenyl), the ester of thionophosphoric acid, toluene diisocyanatetrimethylol propane adduct, the reaction product of toluene diisocyanate and hexamethylene diisocyanate (3:2), and the like. The choice of the isocyanate to be utilized depends on the type of polymer to be modified, and the end result to be expected, as is known to those skilled in the art.

The isocyanate-modified polymers of this invention can be prepared by reacting the hydroxyl, amino or thio groups on the polymers with the organic isocyanates. The reaction is typically carried out in an organic solvent which is completely inert toward the organic isocyanates, such as tetrahydrofuran, dioxane, acetone, methyl ethyl ketone, and like, at room temperature, or at reflux temperature. Usual catalysts for the isocyanate reaction, such as dibutyltin dilaurate, are optionally added.

A suitable method for preparing a lithographic printing plate is to dissolve the isocyanate-modified polymers and the light-sensitive naphthoquinone diazide derivatives in an organic solvent, such as acetone, methyl ethyl ketone, methyl cellosolve, methyl cellosolve acetate, tetrahydrofuran or mixtures thereof in various proportions, and to apply the solution onto a suitable base sheet or substrate, preferably an aluminum sheet. The coating may be applied, e.g. by immersion or casting and draining, or by casting and centrifuging off the excess of the solution, by brushing, by swabbing, by roller-coating, or by any other method known of application. The coating thus applied is then dried at room temperature or at an elevated temperature.

The coating solution should contain at least about one part by weight of each of the light-sensitive compounds and the isocyanate-modified polymeric materials per 100 parts of the organic solvent, desirably about 2 to about 20 parts, and preferably about 3 to about 10 parts. The isocyanate-modified polymers can be used in an amount of up to about 10 times by weight of the amount of the light-sensitive compounds. Desirably, the polymer is used in an amount of at least about 0.1 part by weight per part of the light-sensitive compound, and, preferably, in an amount of about 0.5 to about 5 parts by weight of polymeric material per part of light-sensitive compound.

It is desirable to include in the coating a small amount of indicator to show the image area on the developed plate, for example, a dye that changes color upon light exposure or upon decomposition of the naphthoquinone diazide compounds, such as diethylaminoazobenzene, thus making it easy to distinguish the image area from the non-image area immediately upon exposure of the plate.

Significantly improved lithographic printing plates can be obtained by modifying a phenol-formaldehyde resin, such as the "Alnovol PN 430" widely used in prior art, with organic isocyanates. The amount of the isocyanates is desirably in the range of 0.1 part to 60 parts by weight per 100 parts by weight of the resin, if a monoisocyanate is used; and from 0.1 part to 15 parts by weight per 100 parts by weight of the resin, if a diisocyanate or polyisocyanate is used. The preferred range is from about 2 to 35 parts by weight of monoisocyanate per 100 parts by weight of the resin, and from 0.1 part to 10 parts by weight of diisocyanate or polyisocyanate per 100 parts by weight of the resin. The condensation product formed by reaction of phenol-formaldehyde resin with organic isocyanate are characterized by having free hydroxy groups. Lithographic printing plates, prepared with these isocyanate-modified phenol-formaldehyde resins in the coating formulations, show substantially increased press runs, significantly improved adhesion, wear and abrasion resistance and greater resistance to prolonged immersion in an alkaline-aqueous developer than the corresponding printing plates with unmodified resin in the formulation, and yet are still easy to develop. Also, in those cases where the developed plates are subjected to heat treatment at an elevated temperature sufficient to cause melting of the coating, it is observed that the number of pinholes and spots is greatly reduced, or completely eliminated.

The compositions of the diazo sensitizers and organic isocyanates used in the appended examples are given in the following Tables I and II, respectively. Table III gives specifications of the novolak resins used in the examples.

TABLE I

Diazo Sensitizers

Diazo I — 2,2'Bis[naphthoquinone-(1,2)-diazide-(2)-sulfonyl-hydroxy-(5)]-dinaphthyl-(1,1')-methane Diazo II — 2,4-Bis-[naphthoquinone-(1,2)diazide-(2)-sulfonyl hydroxy-(5)]-dihydroxybenzophenone Diazo III — Ester of naphthoquinone-(1,2)-diazide-(2)-sulfonic acid-(5) and 1,2,3-trihydroxybenzophenone Diazo IV — Naphthoquinone (1,2)-diazide-(2) sulfonic-acid chloride (4)

Diazo V — Naphthoquinone-(1,2)-diazide-(2)-sulfonyl-hydroxy-(4)-phenylcumene

TABLE II

Isocyanates

1. Trimethyl hexamethylene diisocyanate
2. Toluene diisocyanate trimethylol propane adduct
3. Reaction product of toluene diisocyanate and hexamethylene diisocyanate (3:2)
4. Tris (4-isocyanatophenyl) ester of thionophosphoric acid
5. Butyl isocyanate
6. Tonco 70 (%) (Octadecylisocyanate-Technical—Upjohn Co.)
7. Tonco 90 (%) (Octadecylisocyanate-Technical—Upjohn Co.)
8. Cyclohexylisocyanate
9. P-methoxyphenylisocyanate
10. Hexamethylene diisocyanate

TABLE III

| Alnovol Novolak Phenolic Resins | | | |
|---|---|---|---|
| Alnovol No. | Melting Point | Acid No. | Density |
| PN 320 | 83°–88° C. | 1 | ca. 1.25 |
| PN 430 | 110°–120° C. | 1 | 1.2 |

The following examples illustrate preferred embodiments of the invention and are not to be considered as limiting the scope of the present invention. Unless otherwise stated, percentages and parts are all by weight.

EXAMPLE 1

An electrolytically-roughened aluminum foil is coated, for example on a whirler, with a solution containing 6.5 parts of butyl isocyanate-modified phenolic resin and 2.2 parts of Diazo III in 100 parts of methyl cellosolve. The coated aluminum foil is then dried, exposed to light under a positive master, developed with a 3.5 percent solution of trisodium phosphate adjusted to pH 12.8 with sodium hydroxide, rinsed with water and subsequently made ready for printing by wiping with a 1 percent solution of phosphoric acid. Prolonged immersion of the plate in the developer solution for 15 minutes caused practically no loss of the image. The plate was then run on a press, and showed no wear up to 65,000 impressions.

A butyl isocyanate-modified phenolic resin is prepared as follows:

100 parts of finely pulverized novolak (e.g. the product marketed under the trademark "Alnovol PN 430") is dissolved in 200 parts of tetrahydrofuran. 7.5 parts of butyl isocyanate and 0.5 part of dibutyltin dilaurate are added. The mixture is refluxed for 2 hours, then vacuum distilled. The residue is cooled down to room temperature, finally pulverized and then dried in a vacuum oven. The polymer melt temperature is 105° C. The infra-red spectrum showed no isocyanate absorption at 2260 cm$^{-1}$.

EXAMPLE 2

The procedure of Example 1 was followed to prepare a lithographic plate with a coating containing the following ingredients.

|  | Parts |
|---|---|
| Diazo III | 2.2 |
| "Tonco 70"-phenolic resin condensation product | 6.5 |
| Methyl cellosolve | 100.0 |
| 5-(p-Diethylamino-benzylidene) rhodamine | 0.2 |

The plate was satisfactorily exposed and developed as described in Example 1, and had a useful life of over 45,000 impressions.

A "Tonco 70"-modified phenolic resin is prepared as follows:

100 parts of finely pulverized novolak ("Alnovol PN 430") is dissolved in 200 parts of tetrahydrofuran. 7.5 parts of Tonco 70 (technical grade octadecyl-isocyanate marketed by the Upjohn Company, Polymer Chemicals Div., Laporte, Texas, U.S.A.) and 0.5 parts of dibutyltindilaurate are added. The mixture is refluxed for 2 hours, 400 parts of methanol is than added and the mixture is added dropwise to 3 liters of water. The precipitate is collected by filtration, and then dried in a vacuum oven. The polymer melt temperature is 98° C.

EXAMPLE 3

The procedure of Example 1 was followed to prepare a lithographic plate with a coating containing the following ingredients:

|  | Parts |
|---|---|
| Diazo III | 2.2 |
| Cyclohexyl isocyanate-modified phenolic resin | 6.5 |
| Methyl Cellosolve | 100.0 |
| 4-diethylaminoazobenzene | 0.3 |

The plate was satisfactorily exposed and developed as described in Example 1, and had a useful press life of over 45,000 impressions.

A cyclohexyl isocyanate-modified phenolic resin is prepared according to the general procedure described in Example 2.

EXAMPLE 4

The procedure of Example 1 was followed to prepare a lithographic plate with a coating containing the following ingredients.

|  | Parts |
|---|---|
| Diazo III | 2.2 |
| P-methoxyphenyl isocyanate-modified phenolic resin | 6.5 |
| Methyl cellosolve | 100.0 |
| 4-Diethylaminoazobenzene | 0.3 |

The plate was satisfactorily exposed and developed as described in Example 1, and had a useful press life of over 55,000 impressions.

A p-methoxyphenyl isocyanate-modified phenolic resin is prepared according to the general procedure described in Example 2.

EXAMPLE 5

The procedure of Example 1 was followed to prepare a lithographic plate with a coating containing the following ingredients.

| | Parts |
|---|---|
| Diazo III | 2.2 |
| Hexamethylene diisocyanate-modified phenolic resin | 6.5 |
| Methyl cellosolve | 100.0 |
| 4-Diethylaminoazobenzene | 0.3 |

The plate is exposed to light under a positive master, developed with a 2 percent solution of trisodium phosphate, rinsed with water and subsequently made ready for printing by wiping with 1 percent solution of phosphoric acid. The developed plate is then exposed briefly to light and then heated to 250° C. in an oven for 10 minutes. The printing surface is found to be free of pinholes and spots.

A hexamethylene diisocyanate-modified phenolic resin is prepared as follows:

100 parts of finely pulverized novolak ("Alnovol PN 430") is dissolved in 200 parts of tetrahydrofuran and 4 parts of hexamethylene diisocyanate and 0.5 part of dibutyltin dilaurate are added. The mixture is agitated at room temperature until it is completely in solution. It is then set overnight. 200 parts of methyl alcohol is added to the mixture. The solution is then added dropwise to 5 liters of water. The precipitate is collected by filtration and then dried in an oven. The polymer melt temperature is 110°–145° C.

In the following examples, diazo sensitizers, isocyanates, and novolaks are selected from Tables I–III, respectively. In addition, novolaks are reacted with isocyanates to form isocyanate-modified resins according to the formulas enumerated in Table IV. The general procedure for the preparation of resins 1–9 in Table IV, follows.

EXAMPLE 6

In a 3-necked flask, equipped with a stirrer, reflux condenser and drying tube, tetrahydrofuran is introduced and then the appropriate novolak resin added in one or two portions. The isocyanate and four drops of cobalt naphthenate are added with concurrent heating to 60° C. The reaction time is three hours at 60° C. Next, the solution is cooled to room temperature with continued stirring and stored until used.

TABLE IV

Isocyanate Modified Novolak Resins
The resins are the products of the reaction of the ingredients shown. (All weights are in grams)

| | | |
|---|---|---|
| 1. | Alnovol PN 430 | 144.18 |
| | Butyl isocyanate | 4.96 |
| | Toluene diisocyanate-trimethylolpropane adduct | 1.86 |
| 2. | Alnovol PN 430 | 96.2 |
| | Diphenylmethan-4,4'-diisocyanate | 2.5 |
| 3. | Alnovol PN 320 | 173.0 |
| | Reaction product of toluene diisocyanate and hexamethylene diisocyanate (3:2) | 17.4 |
| 4. | Alnovol PN 430 | 140.0 |
| | Toluene diisocyanate-trimethylolpropane adduct | 6.56 |
| 5. | Alnovol PN 430 | 233.0 |
| | Trimethyl hexamethylene diisocyanate | 5.25 |
| 6. | Alnovol PN 430 | 187.0 |
| | Reaction product of toluene diisocyanate and hexamethylene diisocyanate (3:2) | 8.59 |
| 7. | Alnovol PN 430 | 144.0 |
| | Tris (4-isocyanatophenyl) ester of thionophosphoric acid | 4.65 |
| 8. | Alnovol PN 430 | 144.18 |
| | Butyl isocyanate | 4.96 |
| 9. | Alnovol PN 430 | 187.0 |
| | Toluene diisocyanate-trimethylolpropane adduct | 6.56 |

EXAMPLE 7

Wire brushed aluminum was coated with a light-sensitive solution of the following composition:

| | |
|---|---|
| 0.5 g | Diazo I |
| 1.5 g | Diazo II |
| 6.0 g | Resin 1 |
| 0.07 g | Dimethylaminoazobenzene | in a solvent mixture of 5 parts tetrahydrofuran, 4 parts of methylglycol, and 1 part of butyl acetate. A coating thickness of 2 g/m² was obtained.

EXAMPLE 8

Mechanically brushed aluminum was coated with a light-sensitive solution of the following composition:

| | |
|---|---|
| 0.5 g | Diazo I |
| 1.5 g | Diazo II |
| 6.0 g | Resin 2 |
| 0.1 g | Crystal violet |
| 0.07 g | Dimethylaminoazobenzene | in the same solvent mixture, resulting in the same coating thickness as in Example 1.

EXAMPLE 9

Wire brushed aluminum was coated with:

| | |
|---|---|
| 0.5 g | Diazo I |
| 1.5 g | Diazo II |
| 6.0 g | Resin 3 |
| 0.1 g | Crystal violet |
| 0.07 g | Dimethylaminoazobenzene. | in a solvent mixture as in Example 7, to a coating thickness of 1.55 g/m².

EXAMPLE 10

Wire brushed aluminum was coated with a solution of:

| | |
|---|---|
| 1.3 g | Diazo III |
| 0.7 g | Diazo I |
| 7.0 g | Resin 4 |
| 0.1 g | Crystal violet |
| 0.06 g | Dimethylaminoazobenzene | as in Example 7.

EXAMPLE 11

Wet brushed aluminum was coated with a solution of the following composition:

| | |
|---|---|
| 2.0 g | Diazo II |
| 0.5 g | Diazo IV |
| 8.0 g | Resin 5 |
| 0.2 g | Epon 1001 (Shell Chemical Co. bisphenol A-epichlorohydrin reaction product) |
| 0.08 g | Crystal violet, | in the previous solvent mixture. A coating thickness of 2.3 g/m² was obtained.

EXAMPLE 12

Electrochemically grained, anodized aluminum was coated with the following composition:

| | |
|---|---|
| 1.3 g | Diazo V |
| 0.65 g | Diazo I |
| 7.8 g | Resin 6 |
| 0.2 g | Epon 1001 |
| 0.045 g | Crystal violet |
| 0.09 g | Diazo IV. |

A coating thickness of 4.10 g/m² was obtained.

The coatings of Examples 7–12 were imaged as follows:

They were exposed under a positive transparent pattern so that step 4 of the UGRA stepwedge was just clean when the coating was developed with an aqueous alkaline developer of U.S. Pat. No. 3,110,596. After a rinse with dilute phosphoric acid, the plate was mounted on an offset printing press.

EXAMPLE 13

An aluminum/copper/chromium trimetal plate was coated with the following composition:

| | |
|---|---|
| 2.5 g | Diazo III |
| 4.2 g | Resin 7 |
| 0.84 g | Polyvinyl acetate, Hoechst AG |
| 0.17 g | Crystal violet, | from the usual solvent mixture, resulting in a coating thickness of 1.9 g/m².

The coating was exposed through a negative transparent pattern and developed with an aqueous alkali-soluble developer. The developed plate was etched with a mixture of aluminum and zinc chlorides containing phosphoric acid. The residual coating was removed with an alcoholic solution of sulfuric acid.

EXAMPLE 14

A dimensionally-stable polyester film was coated with the solution of the following, in the same solvent mixtures used in Example 7:

| | |
|---|---|
| 0.81 g | Diazo III |
| 0.4 g | Resin 8 |
| 0.4 g | Zapon Fast Red (made by BASF) |
| 0.4 g | Zapon Fast Red BB |

A coating thickness of 1 g/m² resulted. After exposure, the coating was developed with a diluted aqueous alkali solution of phosphates and metasilicate salts.

EXAMPLE 15

A copper foil-phenolic resin laminate, conventionally used for printed circuit manufacture, was coated with the following:

| | |
|---|---|
| 3.0 g | Diazo III |
| 10.0 g | Resin 9 |
| 0.3 g | Castor oil |
| 0.5 g | Methylviolet BB, | in the usual solvent mixture. After the customary exposure and development with the solution of Example 14, the copperboard was etched with a concentrated ferric chloride solution.

EXAMPLE 16

A dimensionally-stable polyester film was coated with the following:

| | |
|---|---|
| 3.5 g | Diazo V |
| 12.0 g | Resin 10 |
| 3.0 g | Copolymer of vinyl acetate and crotonic acid |
| 5.0 g | Polyglycol (mol. wt. 2000) |
| 4.5 g | Terpolymer of n-hexylmethacrylate, methyl methacrylate, and methacrylic acid |
| 0.05 g | Crystal violet |
| 12.0 g | Plexisol B-574 (low viscosity polyethylacrylate-40% solution [made by Roehm AG Darmstadt]) |

A cover foil of polyethylene was placed in contact with the dried coating. To make a printed circuit, the surface of a copper board was cleaned, the cover foil was stripped on and the coating surface laminated to the copper surface at about 120° C.; the polyester film was removed; and the transferred coating was post dried at 100° C., exposed and developed in an aqueous alkaline developer having a pH of 13.6. The coating is well suited as an etch resist for copper with strong ferric chloride solutions and as a plating resist.

It will be obvious to those skilled in the art that many modifications may be made within the scope of the present invention without departing from the spirit thereof, and the invention includes all such modifications.

What is claimed is:

1. A positive-working, light-sensitive coating composition comprising at least one solvent-soluble, isocyanate-free, free hydroxy-containing condensation product of an organic isocyanate and a phenol-formaldehyde novolak resin, in admixture with at least one light-sensitive diazo compound selected from the group consisting of esters and amides of o-quinone diazides and mixtures thereof, said composition being soluble in aqueous alkaline developer solution after exposure to light.

2. A composition in accordance with claim 1 wherein the printing plate developer is an aqueous alkaline solution.

3. A composition in accordance with claim 1 wherein the printing plate developer is an organic solvent.

4. A composition in accordance with claim 1 wherein the developer solution is a mixture of an aqueous alkaline solution and an organic solvent.

5. A composition in accordance with claim 1 wherein the ratio of isocyanate to novolak resin is within the range of about 0.1 to 60 parts by weight of isocyanate per 100 parts by weight of novolak resin.

6. A composition in accordance with claim 1 wherein the organic isocyanate is selected from the group consisting of a diisocyanate and polyisocyanate and is present in the range of about 0.1 to 15 parts by weight per 100 parts by weight of novolak resin.

7. A composition in accordance with claim 1 wherein said organic isocyanate is a mono-isocyanate.

8. A composition in accordance with claim 7 wherein the ratio of isocyanate to novolak resin is within the range of about 0.1 to 60 parts by weight of isocyanate per 100 parts by weight of novolak resin.

9. A composition in accordance with claim 8 wherein the ratio of mono-isocyanate to novolak resin is within the range of about 2 to 35 parts by weight of mono-isocyanate per 100 parts by weight of novolak resin.

10. A composition in accordance with claim 1 wherein said condensation product is present in the range of about 0.1 to 10 parts by weight per part by weight of said light-sensitive diazo compound.

11. A light-sensitive material comprising a supported positive-working, light-sensitive coating composition as described in claim 1.

12. A light-sensitive material in accordance with claim 11 in which the organic isocyanate is a mono-isocyanate.

13. A material in accordance with claim 11 wherein the material is a printing plate.

14. A material in accordance with claim 9 wherein the support is an aluminum plate.

15. A material in accordance with claim 11 wherein the material is a photoresist.

16. A material in accordance with claim 11 wherein the support is an aluminum/copper/chromium trimetal plate.

17. A material in accordance with claim 11 wherein the support is a copper foil-phenolic resin laminate.

18. A material in accordance with claim 11 wherein the support is a copper board.

19. A method which comprises exposing a supported, light-sensitive coating composition as described in claim 1 to light under a pattern and developing the resulting image with an aqueous alkaline solution and/or organic solvent which removes the light-exposed areas of the coating.

* * * * *